(12) United States Patent
Choi et al.

(10) Patent No.: US 9,366,897 B2
(45) Date of Patent: Jun. 14, 2016

(54) DISPLAY DEVICE AND MANUFACTURING METHOD THEREOF

(71) Applicant: Samsung Display Co., Ltd., Yongin, Gyeonggi-do (KR)

(72) Inventors: Sang Gun Choi, Suwon-si (KR); Seung-Yeon Chae, Hwaseong-si (KR); Hee-Keun Lee, Suwon-si (KR); Tae Woon Cha, Seoul (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/564,953

(22) Filed: Dec. 9, 2014

(65) Prior Publication Data

US 2016/0011447 A1 Jan. 14, 2016

(30) Foreign Application Priority Data

Jul. 9, 2014 (KR) .......................... 10-2014-0086239

(51) Int. Cl.
| | | |
|---|---|---|
| *H01J 9/00* | (2006.01) | |
| *H01J 9/24* | (2006.01) | |
| *G02F 1/1339* | (2006.01) | |
| *G02F 1/1333* | (2006.01) | |
| *G02F 1/1368* | (2006.01) | |
| *G02F 1/1343* | (2006.01) | |
| *G02F 1/1341* | (2006.01) | |
| *H01L 27/12* | (2006.01) | |

(52) U.S. Cl.
CPC .......... *G02F 1/13338* (2013.01); *G02F 1/1339* (2013.01); *G02F 1/1341* (2013.01); *G02F 1/1368* (2013.01); *G02F 1/13439* (2013.01); *G02F 1/133345* (2013.01); *G02F 1/133377* (2013.01); *H01L 27/1262* (2013.01)

(58) Field of Classification Search
CPC .......... G02F 1/13338; G02F 1/133377; G02F 1/1341; G02F 1/1368; G02F 1/1339; G02F 1/13345; G02F 1/13439; H01L 27/1262
See application file for complete search history.

(56) References Cited

U.S. PATENT DOCUMENTS

2010/0053529 A1* 3/2010 Kanaya ............... G02F 1/13394
349/139

(Continued)

FOREIGN PATENT DOCUMENTS

| KR | 1020090020772 A | 2/2009 |
|---|---|---|
| KR | 1020100067236 A | 6/2010 |
| KR | 1020140016593 A | 2/2014 |

*Primary Examiner* — Donald Raleigh
(74) *Attorney, Agent, or Firm* — Robert E. Bushnell, Esq.

(57) ABSTRACT

The present invention provides a display device including a substrate including a plurality of pixel areas, a thin film transistor formed on the substrate, a common electrode and a pixel electrode formed on the thin film transistor, a liquid crystal layer filling a microcavity formed on the common electrode and the pixel electrode, a lower insulating layer formed to be spaced apart from the common electrode and the pixel electrode, a roof layer formed on the lower insulating layer, an intermediate insulating layer formed on the roof layer, a first touch sensing electrode formed on the intermediate insulating layer, an injection hole partially exposing the microcavity formed in the roof layer, the intermediate insulating layer, and the first touch sensing electrode, an overcoat formed on the first touch sensing electrode to cover the injection hole and sealing the microcavity, and a second touch sensing electrode formed on the overcoat.

21 Claims, 13 Drawing Sheets

(56) References Cited

U.S. PATENT DOCUMENTS

| | | | |
|---|---|---|---|
| 2012/0159780 A1* | 6/2012 | Chan | G02F 1/13338 29/832 |
| 2012/0224114 A1* | 9/2012 | Kunimatsu | G02F 1/133345 349/42 |
| 2014/0168152 A1* | 6/2014 | Ishizaki | G06F 3/044 345/174 |
| 2014/0184940 A1* | 7/2014 | Ma | G02F 1/13338 349/12 |
| 2014/0333849 A1* | 11/2014 | Ma | G02F 1/13338 349/12 |

* cited by examiner

DISPLAY DEVICE AND MANUFACTURING METHOD THEREOF

CLAIM OF PRIORITY

This application claims priority to and the benefit of Korean Patent Application No. 10-2014-0086239 filed in the Korean Intellectual Property Office on Jul. 9, 2014, the entire contents of which are incorporated herein by reference.

BACKGROUND OF THE INVENTION

1. Field of the Invention

The present invention relates to a display device and a manufacturing method thereof, and more particularly, to a display device formed with a touch electrode on its top surface and a manufacturing method thereof.

2. Description of the Related Art

As one of the most widely used flat panel displays at present, a liquid crystal display (LCD) includes two display panels on which electric field generating electrodes such as a pixel electrode and a common electrode are formed, and a liquid crystal layer interposed between the two display panels. The LCD generates an electric field on a liquid crystal layer by applying a voltage to the electric field generating electrodes, determines alignment directions of liquid crystal molecules of the liquid crystal layer through the generated electric field, and controls polarization of incident light, thereby displaying an image.

Two sheets of display panels of which the LCD consists may include a thin film transistor array panel and an opposing display panel.

In the thin film transistor array panel, a gate line for transmitting a gate signal and a data line for transmitting a data signal are formed to cross each other, and a thin film transistor coupled to the gate line and the data line, a pixel electrode coupled to the thin film transistor, and the like may be formed.

In the opposing display panel, a light blocking member, a color filter, a common electrode, and the like may be formed.

If necessary, the light blocking member, the color filter, and the common electrode may be formed on the thin film transistor array panel.

However, in a contemporary liquid crystal display, two substrates are indispensably used and constituent elements are separately formed on the two substrates, thereby requiring a long processing time as well as making the display device heavy, thick, and costly.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a display device and a manufacturing method thereof that can reduce a thickness, a width, a cost, and a processing time by manufacturing the display device using one substrate.

In addition, a display device and a manufacturing method thereof having a simplified structure and a simplified manufacturing process are provided by integrally forming a touch electrode with a top surface of the display device.

An exemplary embodiment of the present invention provides a display device including: a substrate including a plurality of pixel areas; a thin film transistor formed on the substrate; a common electrode and a pixel electrode formed on the thin film transistor to overlap each other while interposing an insulating layer therebetween; a liquid crystal layer filling a microcavity formed on the common electrode and the pixel electrode; a lower insulating layer formed to be spaced apart from the common electrode and the pixel electrode while interposing the microcavity therebetween and a roof layer formed on the lower insulating layer; an intermediate insulating layer formed on the roof layer; a first touch sensing electrode formed on the intermediate insulating layer; an injection hole partially exposing the microcavity formed in the roof layer, the intermediate insulating layer, and the first touch sensing electrode; an overcoat formed on the first touch sensing electrode to cover the injection hole and sealing the microcavity; and a second touch sensing electrode formed on the overcoat.

The plurality of pixel areas may be differentiated by a first valley that is formed with the injection hole in a row direction and a second valley that is formed between the plurality of pixel areas in a column direction.

The first touch sensing electrode may be formed in each pixel area and the second valley along the plurality of pixel rows, and the second touch sensing electrode may be formed in each pixel area and the first valley along the plurality of pixel columns.

The first touch sensing electrode may not be formed in the first valley, and the second touch sensing electrode may not be formed in the second valley.

The first and second touch sensing electrodes may be formed of one or more selected from a silver nanowire (AgNW), ITO, IZO, carbon nanotubes (CNT), graphene, a metal mesh, and a conductive polymer.

The display device may further include an upper insulating layer formed on the second touch sensing electrode and the overcoat.

The lower insulating layer, the intermediate insulating layer, and the upper insulating layer may be formed of one or more selected from a silicon nitride (SiNx), a silicon oxide (SiOx), and a silicon oxynitride (SiOxNy).

In addition, another exemplary embodiment of the present invention provides a display device, including: a substrate including a plurality of pixel area; a thin film transistor formed on the substrate; a common electrode and a pixel electrode formed on the thin film transistor to overlap each other while interposing an insulating layer therebetween; a lower insulating layer formed to be spaced apart from the pixel electrode while interposing a microcavity therebetween; a first touch sensing electrode formed on the lower insulating layer; a roof layer formed on the first touch sensing electrode; an intermediate insulating layer formed on the roof layer; an injection hole positioned at one or more edges of the roof layer to partially expose the microcavity; a liquid crystal layer filling the microcavity; an overcoat covering the injection hole to seal the microcavity; and a second touch sensing electrode formed on the overcoat.

In addition, a further exemplary embodiment of the present invention provides a manufacturing method of a display device, including: forming a thin film transistor on a substrate; forming a common electrode on the thin film transistor; forming a pixel electrode overlapping the common electrode while interposing an insulating layer therebetween and coupled to the thin film transistor; forming a sacrificial layer on the pixel electrode; forming a lower insulating layer on the sacrificial layer; forming a roof layer by coating and then patterning an organic material on the lower insulating layer; forming an intermediate insulating layer on the roof layer and a first touch sensing electrode on the intermediate insulating layer; exposing the sacrificial layer; removing the exposed sacrificial layer to form an injection hole and a microcavity between the lower insulating layer and the pixel electrode and then injecting a liquid crystal material into the microcavity through the injection hole; sealing the microcavity by forming an overcoat on the first touch sensing electrode and the roof layer; forming a second touch sensing electrode on the overcoat; and forming an upper insulating layer on the second touch sensing electrode.

In addition, a further exemplary embodiment of the present invention provides a manufacturing method of a display device, including: forming a thin film transistor on a substrate; forming a common electrode on the thin film transistor; forming a pixel electrode overlapping the common electrode while interposing an insulating layer therebetween and coupled to the thin film transistor; forming a sacrificial layer on the pixel electrode; forming a lower insulating layer on the sacrificial layer; forming a first touch sensing electrode on the lower insulating layer; forming a roof layer by coating and then patterning an organic material on the first touch sensing electrode; forming an intermediate insulating layer on the roof layer; exposing the sacrificial layer; removing the exposed sacrificial layer to form an injection hole and a microcavity between the lower insulating layer and the pixel electrode and then injecting a liquid crystal material into the microcavity through the injection hole; forming an overcoat on the intermediate insulating layer to seal the microcavity; and forming a second touch sensing electrode on the overcoat.

According to the exemplary embodiment of the present invention, one substrate is used to manufacture the display device, thereby reducing a thickness, a width, a cost, and a processing time of the display device.

In addition, according to the exemplary embodiment of the present invention, the touch electrode is integrally formed with the top surface of the display device, thereby simplifying the structure and the manufacturing process of the display device.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
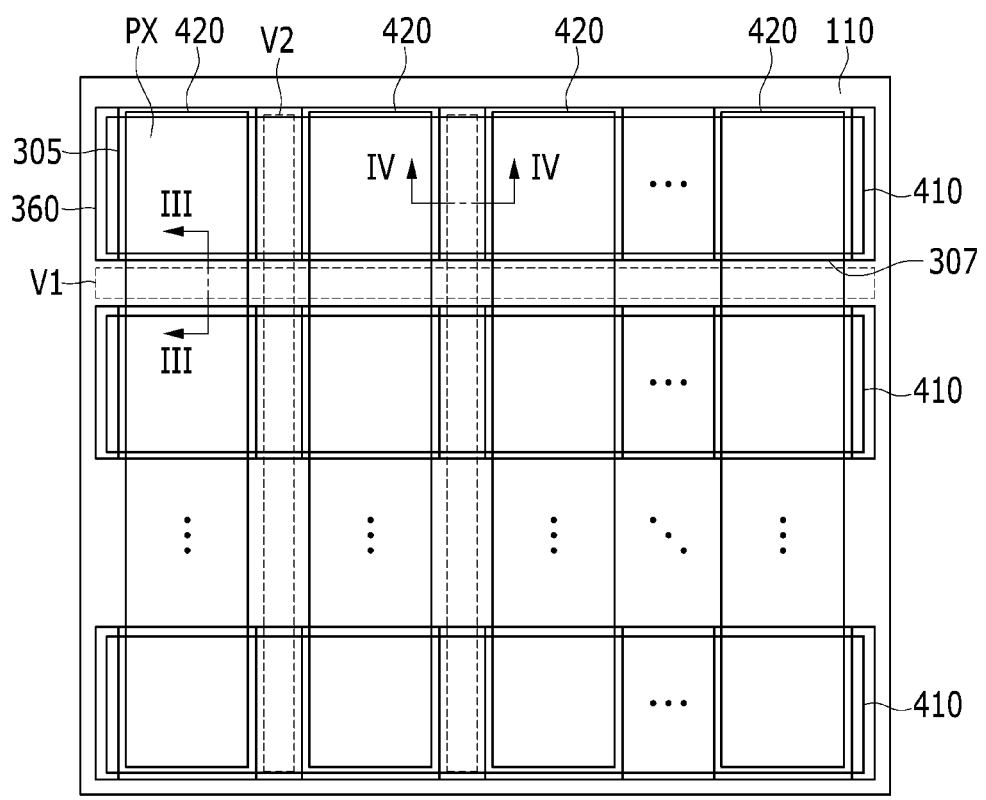
FIG. 1 is a top plan view of a display device according to an exemplary embodiment of the present invention.

The present invention will be described more fully hereinafter with reference to the accompanying drawings, in which exemplary embodiments of the invention are shown.

As those skilled in the art would realize, the described embodiments may be modified in various different ways, all without departing from the spirit or scope of the present invention.

In the drawings, the thickness of layers, films, panels, regions, etc. are exaggerated for clarity.

Like reference numerals designate like elements throughout the specification.

It will be understood that when an element such as a layer, film, region, or substrate is referred to as being "on" another element, it can be directly on the other element or intervening elements may also be present.

In contrast, when an element is referred to as being "directly on" another element, there are no intervening elements present.

First, a display device according to an exemplary embodiment of the present invention will be schematically described with reference to FIG. 1.

FIG. 1 is a top plan view of a display device according to an exemplary embodiment of the present invention.

Referring to FIG. 1, the display device according to the exemplary embodiment of the present invention includes a substrate 110 that is formed of a material such as glass or plastic.

Microcavities 305 covered by a roof layer 360 are formed on the substrate 110.

The roof layer 360 extends in a row direction, and a plurality of microcavities 305 are formed between the roof layer 360 and the substrate.

The microcavities 305 may be arranged in a matrix form, a first valley V1 is positioned between the microcavities 305 that are adjacent to each other in a column direction perpendicular to the row direction, and a second valley V2 is positioned between the microcavities 305 that are adjacent to each other in the row direction.

A plurality of roof layers 360 are separated from each other in the column direction while interposing the first valleys V1 therebetween.

The microcavity 305 may not be covered by the roof layer 360 in a region where it contacts the first valley V1, thereby being exposed outside.

Figure 11:
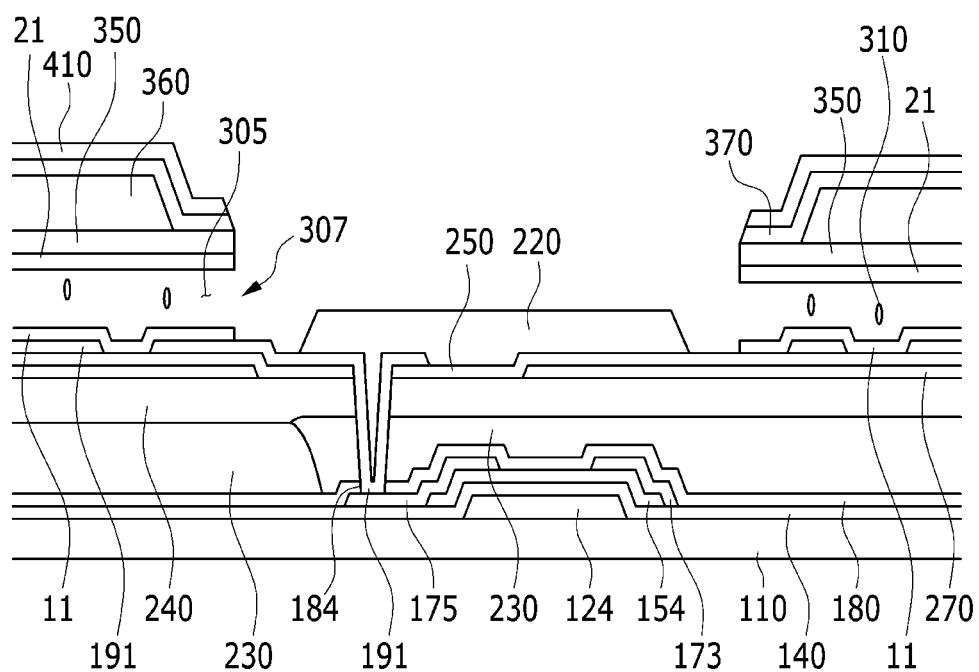

This is referred to as an injection hole 307 which is also shown in FIG. 11.

The injection hole 307 is formed at one edge of the microcavity 305.

Each roof layer 360 is formed between the adjacent second valleys V2 to be separated from the substrate 110, thereby forming the microcavity 305. That is, the roof layer 360 is formed to cover all sides of a first edge except for a lateral side thereof where the injection hole 307 is formed. Thus, the roof layer 360 includes a side wall having three sides excluding the lateral side of the first edge, and a top side covering the side wall.

In this case, a lateral side positioned at the edge facing the injection hole 307 may be a horizontal support member, and a lateral side positioned at the edge coupled to the horizontal supporting member to form the side wall may be a vertical support member.

In each row direction along which each roof layer 360 is formed and in each column direction along which each microcavity 305 is formed, first touch sensing electrodes 410 and second touch sensing electrodes 420 are formed at an upper part of the roof layer 360.

The first touch sensing electrode 410 integrally formed with the roof layer 360 along the row direction may be formed under the second touch sensing electrode 420 that is formed in each column direction along which the microcavities 305 are formed, but it is not limited thereto.

The first touch sensing electrode 410 and the second touch sensing electrode 420 function to sense contact when an object approaches or contacts the display device. In this case, the contact includes not only a touch in which an external object such as a user's finger directly touches the display device, but also a hovering touch in which an external object approaches the display device or hovers while approaching it.

The first and second touch sensing electrodes 410 and 420 may be configured to convert a pressure applied to a specific point or capacitance variation generated at a specific location into an electrical input signal.

A plurality of signal wires extending from the first and second touch sensing electrodes 410 and 420 may be disposed outside of the display device for signal transmission, and the signal wires may be coupled to a sensing signal controller (not shown) for controlling the first and second touch sensing electrodes 410 and 420 such that it transmits a sensing input signal or sensing output signal thereto.

In the display device according to one exemplary embodiment of the present invention, the first and second touch sensing electrodes 410 and 420 can be arranged in each row direction and each column direction along which the roof layers 360 and the microcavities 305 are formed.

That is, the first touch sensing electrodes 410 are not formed in the first valley V1 but are formed in each pixel area PX and the second valley V2 along a pixel row, and the second touch sensing electrodes 420 are not formed in the second valley V2 but are formed in each pixel area PX and first valley V1 along a pixel column.

The first and second touch sensing electrodes 410 and 420 may sense contacts in various ways.

For example, the first and second touch sensing electrodes 410 and 420 can be classified into various types such as a resistive type, a capacitive type, an electro-magnetic type (EM), and an optical type.

The exemplary embodiment of the present invention will be described with respect to a capacitive type touch sensing electrode as an example.

The aforementioned structure of the display device according to the exemplary embodiment of the present invention can be seen as an example, and thus it can be modified in various ways.

For example, the arrangement of the microcavity 305, the first valley V1, and the second valley V2 may be modified, a plurality of roof layers 360 may be coupled to each other in the first valley V1, and each roof layer 360 may be formed to be partially separated from the substrate 110 in the second valley V2 such that the adjacent microcavities 305 are coupled to each other.

Figure 2:
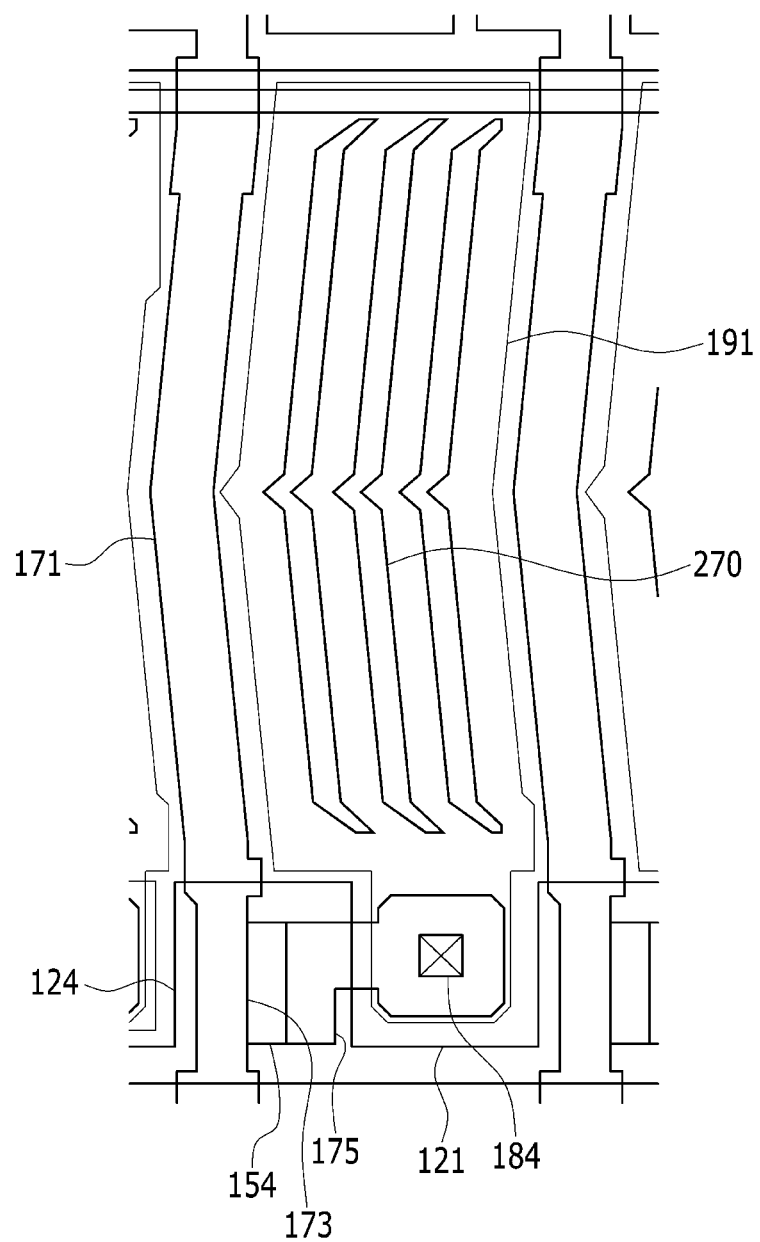
FIG. 2 is a top plan view of one pixel of the display device according to the exemplary embodiment of the present invention.
Figure 3:
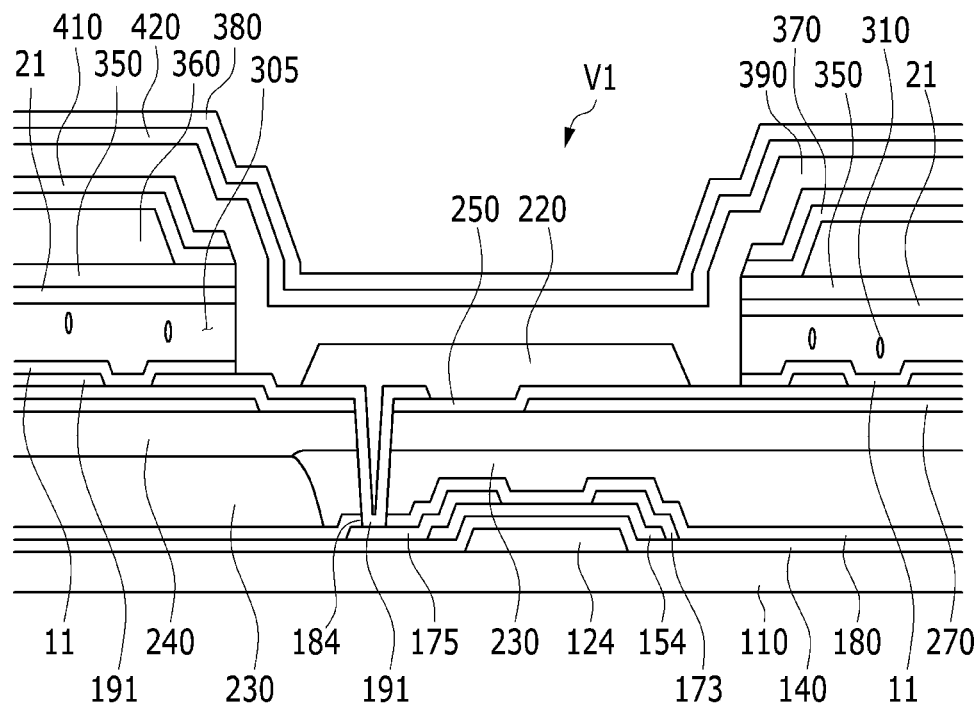
FIG. 3 is a cross-sectional view of FIG. 1 taken along the line III-III.
Figure 4:
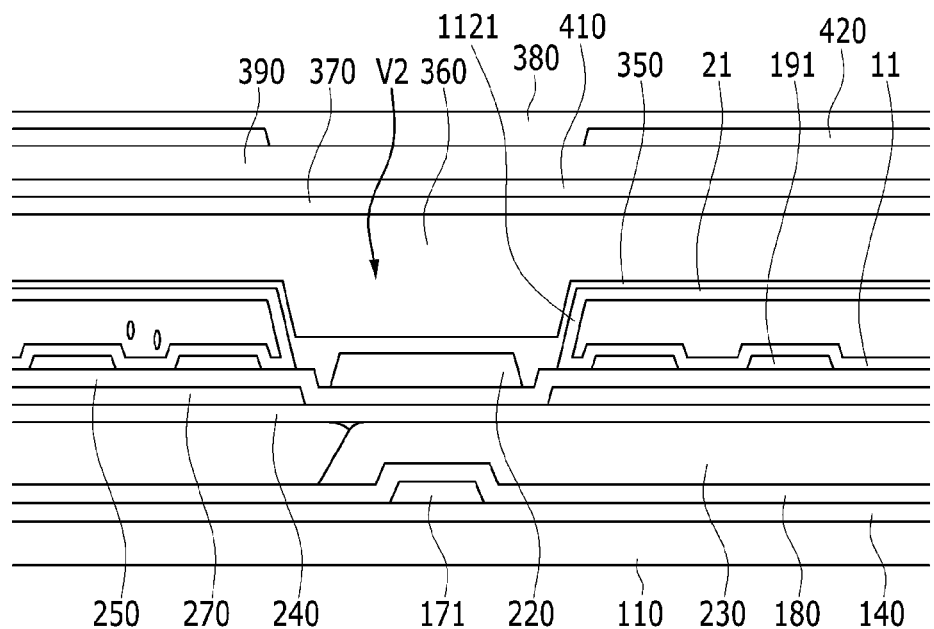
FIG. 4 is a cross-sectional view of FIG. 1 taken along the line IV-IV.

The display device according to the exemplary embodiment of the present invention will now be described with reference to FIGS. 2 to 4. FIG. 2 is a top plan view of one pixel of the display device according to the exemplary embodiment of the present invention. FIG. 3 is a cross-sectional view of FIG. 1 taken along the line III-III. FIG. 4 is a cross-sectional view of FIG. 1 taken along the line IV-IV.

As shown in FIGS. 2-4, a gate conductor including a gate line 121 is formed on an insulation substrate 110 that is formed of transparent glass or plastic. The gate line 121 includes a wide end portion for connection with a gate electrode 124 and other layers or an external driving circuit (not shown). The gate line 121 may be formed of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), and titanium (Ti). However, the gate line 121 may have a multilayer structure including at least two conductive layers having different physical properties.

A gate insulating layer 140 formed of a silicon nitride (SiNx) or a silicon oxide (SiOx) is formed on the gate conductor 121. Alternatively, the gate insulating layer 140 may have a multilayer structure in which at least two insulating layers having different physical properties are included.

A semiconductor 154 formed of amorphous silicon or polysilicon is formed on the gate insulating layer 140. The semiconductor 154 may include an oxide semiconductor.

Ohmic contacts (not shown) are formed on the semiconductor 154. The ohmic contacts may be formed of a material such as n+ hydrogenated amorphous silicon highly doped with an n-type impurity such as phosphorus, or may be formed of a silicide. The ohmic contacts may be coupled in pairs to be disposed on the semiconductor. The ohmic contacts may be omitted if the semiconductor 154 is the oxide semiconductor.

A data line 171 including a source electrode 173 and a data conductor including a drain electrode 175 are formed on the semiconductor 154 and the gate insulating layer 140. The data line 171 includes a wide end portion for connection with another layer or an external driving circuit (not shown). The data line 171 transmits a data signal and mainly extends in a vertical direction to cross the gate line 121.

In this case, in order to obtain maximum transmittance of the liquid crystal display, the data line 171 may include a first curved portion having a curved shape, and parts of the curved portion may meet each other in a middle region of the pixel area to form a V shape.

A second curved portion may be further included in the middle region of the pixel area such that it is curved to form a predetermined angle with the first curved portion.

The first curved portion of the data line 171 may be curved to form an angle of about 7° with a vertical reference line that forms an angle of 90° with a direction in which the gate line 121 extends.

The second curved portion disposed in the intermediate region of the pixel area may be curved to form an angle of about 7° to about 15° with the first curved portion.

The source electrode 173 is a part of the data line 171 and is disposed on the same line as the data line 171.

The drain electrode 175 is formed to extend in parallel with the source electrode 173. Thus, the drain electrode 175 is in parallel with the part of the data line 171.

The gate electrode 124, the source electrode 173, and the drain electrode 175 form one thin film transistor (TFT) along with the semiconductor 154, and a channel of the thin film transistor is formed in the semiconductor 154 between the source electrode 173 and the drain electrode 175.

By including the source electrode 173 that is positioned on the same line as the data line 171 and the drain electrode 175 that extends in parallel with the data line 171, the display device according to the exemplary embodiment of the present invention can increase a width of the thin film transistor without increasing an area taken up by the data conductor, thereby increasing the aperture ratio of the display device.

However, a display device according to another exemplary embodiment of the present invention may be formed such that its source and drain electrodes 173 and 175 have different shapes.

The data line 171 and the drain electrode 175 may be preferably formed of a refractory metal such as molybdenum, chromium, tantalum, titanium, and an alloy thereof, and they may have a multilayer structure including a refractory metal layer (not shown) and a low-resistance conductive layer (not shown).

An example of the multilayer structure may be a double layer of a chromium or molybdenum (alloy) lower layer and an aluminum (alloy) upper layer, or a triple layer of a molybdenum (alloy) lower layer, an aluminum (alloy) middle layer, and a molybdenum (alloy) upper layer.

However, in addition to those described above, the data line 171 and the drain electrode 175 may be made of various metals or conductors.

A passivation layer 180 is disposed on the data conductors 171, 173, and 175, the gate insulating layer 140, and an exposed portion of the semiconductor 154. The passivation layer 180 may be made of an organic insulating material, an inorganic insulating material, or the like.

A color filter 230 is formed in each pixel area PX on the passivation layer 180.

Each color filter 230 may display one of the primary colors such as three primary colors of red, green, and blue.

The color filter 230 is not limited to display the three primary colors of red, green, and blue, but may display cyan, magenta, yellow, and white-based colors.

Unlike those illustrated above, the color filter 230 may be elongated in the column direction along between the adjacent data lines 171.

An organic layer 240 is disposed on the color filter 230. The organic layer 240 has a larger thickness than that of the passivation layer 180, and may have a smooth surface. The organic layer 240 may be disposed in a display area where a plurality of pixels are disposed, and may not be disposed in a peripheral area where a gate pad portion or data pad portion is formed.

Alternatively, the organic layer 240 may be positioned even in the peripheral area where the gate pad portion or data pad portion is formed.

A contact hole 184 is provided in the organic layer 240, the color filter 230, and the passivation layer 180.

A common electrode 270 is positioned on the organic layer 240.

The common electrode 270 may have a planar shape, and may be disposed in the display area where the plurality of pixels are disposed but not in the peripheral area where the gate pad portion or data pad portion is formed. The common electrode 270 is formed of a transparent conductive layer such as indium tin oxide (ITO) or indium zinc oxide (IZO).

An insulating layer 250 is disposed on the common electrode 270. The insulating layer 250 may be formed of an inorganic insulating material such as a silicon nitride (SiNx), a silicon oxide (SiOx), a silicon oxynitride (SiOxNy), etc. The insulating layer 250 serves to protect the color filter 230 made of the organic material and to insulate the common electrode 270 from the pixel electrode 191.

That is, even if the common electrode 270 is formed to overlap the pixel electrode 191, the common electrode 270 and the pixel electrode 191 may be prevented from being short-circuited because the insulating layer 250 is formed on the common electrode 270.

The pixel electrode 191 is disposed on the insulating layer 250. The pixel electrode 191 includes a curved edge that is substantially in parallel with the first and second curved portions of the data line 171. The pixel electrode 191 may be formed of a transparent conductive layer such as ITO or IZO. The pixel electrode 191 is physically and electrically coupled to the drain electrode 175 through the contact hole 184 that is formed in the organic layer 240, the color filter 230, and the passivation layer 180, and is applied with a voltage from the drain electrode 175.

The pixel electrode 191 is applied with a data voltage from the drain electrode 175, and the common electrode 270 is applied with a predetermined reference voltage from a reference voltage applying unit that is disposed outside of the display area.

The pixel electrode 191 and the common electrode 270 generate an electric field according to these applied voltages, and liquid crystal molecules of a liquid crystal layer 310 over the two electrodes 191 and 270 rotate in a direction parallel to a direction of the electric field.

Polarization of light passing through the liquid crystal layer varies depending on rotation directions of the liquid crystal molecules determined as described above.

A lower insulating layer 350 may be further formed on the pixel electrode 191 such that it is separated by a predetermined distance from the pixel electrode 191. The lower insulating layer 350 may be made of an inorganic insulating material such as a silicon nitride (SiNx), a silicon oxide (SiOx), etc.

The microcavity 305 is formed between the pixel electrode 191 and the lower insulating layer 350. That is, the microcavity 305 is enclosed by the pixel electrode 191 and the lower insulating layer 350. Widths and sizes of the microcavity 305 may be variously modified depending on sizes and resolutions of the display devices.

A first alignment layer 11 is formed on the pixel electrode 191. The first alignment layer 11 may be formed directly on the lower insulating layer 350 that is not covered by the pixel electrode 191. A second alignment layer 21 is formed under the lower insulating layer 350 that faces the first alignment layer 11. The first alignment layer 11 and the second alignment layer 21 may be formed as vertical alignment layers, and may be formed of an aligning material such as polyamic acid, polysiloxane, and polyimide. The first and second alignment layers 11 and 21 may be coupled to each other via an alignment connection portion 1121 located at an edge of the pixel area PX as illustrated in FIG. 4.

The liquid crystal layer consisting of the liquid crystal molecules 310 is formed in the microcavity 305 that is positioned between the pixel electrode 191 and the lower insulating layer 350.

Further, a light blocking member 220 is formed in a region between the adjacent color filters 230, and particularly, the light blocking member 220 may be positioned, as illustrated in FIG. 3, on the pixel electrode 191 and the insulating layer 250 that is not covered by the pixel electrode 191.

The light blocking member 220 is formed on a boundary of the pixel area PX and the thin film transistor to prevent light leakage. The light blocking member 220 is upwardly and downwardly expanded while extending along the gate line 121, and may include a horizontal light blocking member covering a region where the thin film transistor and the like are formed and a vertical light blocking member extending along the data line 171. That is, the horizontal light blocking member may be formed in the first valley V1, and the vertical light blocking member may be formed in the second valley V2.

The color filter 230 and the light blocking member 220 may overlap each other in some regions.

The roof layer 360 is formed on the lower insulating layer 350. The roof layer 360 may be formed of an organic material. The microcavity 305 is formed under the roof layer 360, and the roof layer 360 maintains a shape of the microcavity 305 because it is hardened by a hardening process. The roof layer 360 is formed to be spaced apart from the pixel electrode 191 while interposing the microcavity 305 therebetween. The roof layer 360 is formed in each pixel area PX and the second valley V2 along the pixel row, but the roof layer 360 is not formed in the first valley V1.

In the second valley V2, the microcavity 305 is not formed under the roof layer 360.

Thus, a thickness of the roof layer 360 positioned in the second valley V2 may be formed to be greater than that of the roof layer 360 that is positioned in the pixel area PX, and the thicker region may be referred to as a vertical support member.

The microcavity 305 is formed such that its top and lateral sides are covered by the roof layer 360.

The injection hole 307 is formed in the roof layer 360 to partially expose the microcavity 305.

The lower insulating layer 350 adjacent to a region where the injection hole 307 is formed may include a region that protrudes further than the roof layer 360.

Since the injection hole 307 may be formed at least one or more edges of the pixel area PX and the microcavity 305 is exposed by the injection hole 307, an aligning agent or a liquid crystal material may be injected into the microcavity 305 through the injection hole 307.

An intermediate insulating layer 370 may be further formed on the roof layer 360. The intermediate insulating layer 370 may be formed of an inorganic insulating material such as a silicon nitride (SiNx), and a silicon oxide (SiOx). The intermediate insulating layer 370 may be formed to cover the top and lateral sides of the roof layer 360. The intermediate insulating layer 370 serves to protect the roof layer 360 that is formed of an organic material, and may be omitted if necessary. The intermediate insulating layer 370 may contact, as shown in FIG. 3, the lower insulating layer 350 that protrudes further than the roof layer 360 in a region where the injection hole 307 is positioned.

Further, the intermediate insulating layer 370 may have a stepped cross-section due to a step between a region contacting the lower insulating layer 350 and a region covering the roof layer.

Further, the intermediate insulating layer 370 may be coupled to the lower insulating layer 350.

A first touch sensing electrode 410 may be formed on the intermediate insulating layer 370.

In the display device, the first touch sensing electrode 410 may be arranged in each row direction along which the roof layer 360 is formed.

That is, the first touch sensing electrode 410 is formed in each pixel area PX and the second valley V2 along the pixel row, and is not formed in the first valley V1.

In this case, the first touch sensing electrode 410 may be formed at a position corresponding to a position of the intermediate insulating layer 370 on the top side thereof.

The first touch sensing electrode 410 may be formed of a silver nanowire (AgNW), ITO, IZO, CNT, graphene, a metal mesh, or a conductive polymer.

The first touch sensing electrode 410 receives the sensing input signal from the sensing signal controller (not shown) to output the sensing output signal.

The sensing signal controller may process the sensing output signal to generate contact information such as a contact occurrence, a contact position, etc.

When receiving the sensing input signal from the sensing signal controller, the first touch sensing electrode 410 is charged with a predetermined amount of charge, thereby forming a sensing capacitor along with the adjacent first touch sensing electrode 410.

When the contact occurs due to an external object, the amount of charge of the sensing capacitor is changed, and thus a corresponding sensing output signal can be outputted to generally sense surface touch.

An overcoat 390 may be formed on the first touch sensing electrode 410 and the injection hole 307.

The overcoat 390 is formed to cover the injection hole 307 through which the microcavity 305 is partially exposed outside.

That is, the overcoat 390 may seal the microcavity 305 such that the liquid crystal molecules 310 inside the microcavity 305 are not discharged outside.

The overcoat 390 is preferably formed of a material that does not react with the liquid crystal molecules 310 because it contacts the liquid crystal molecules 310.

For example, the overcoat 390 may be formed of parylene and the like.

The overcoat 390 may be formed of a multilayer such as a double layer, a triple layer, etc.

The double layer may consist of two layers that are formed of different materials.

The triple layer consists of three layers, in which forming materials of adjacent layers are different from each other.

For example, the overcoat 390 may include a layer formed of an organic insulating material and a layer formed of an inorganic insulating material.

A second touch sensing electrode 420 may be formed on the overcoat 390.

In the display device, the second touch sensing electrode 420 may be arranged in each column direction along which the microcavity 305 is formed.

That is, the second touch sensing electrode 420 is formed in each pixel area PX and the first valley V1 along the pixel column, but is not formed in the second valley V2.

The second touch sensing electrode 420 may be formed of a silver nanowire (AgNW), ITO, IZO, CNT, graphene, a metal mesh, or a conductive polymer.

The first touch sensing electrode 410 receives the sensing input signal from the sensing signal controller (not shown) to output the sensing output signal.

The sensing signal controller may process the sensing output signal to generate contact information such as a contact occurrence, a contact position, etc.

When receiving the sensing input signal from the sensing signal controller, the first touch sensing electrode 410 is charged with a predetermined amount of charge, thereby forming a sensing capacitor along with the adjacent first touch sensing electrode 410.

When the contact occurs due to an external object, the amount of charge of the sensing capacitor is changed and thus the corresponding sensing output signal can be outputted to generally sense surface touch.

An upper insulating layer 380 may be formed on the second touch sensing electrode 420 and the overcoat 390. The upper insulating layer 380 may be formed of an inorganic insulating material such as a silicon nitride (SiNx), and a silicon oxide (SiOx).

Though not illustrated, polarizers may be further formed on top and bottom surfaces of the display device. The polarizers may consist of a first polarizer and a second polarizer. The first polarizer may be attached to a bottom surface of the substrate 110, and the second polarizer may be attached on top of the upper insulating layer 380. Next, a manufacturing method of a display device according to an exemplary embodiment of the present invention will be sequentially described with reference to FIGS. 5 to 12.

The manufacturing method will be described with further reference to FIGS. 1 to 4 at the same time.

FIGS. 5 to 12 are cross-sectional views sequentially showing the manufacturing method of the display device according to the exemplary embodiment of the present invention.

Figure 5:
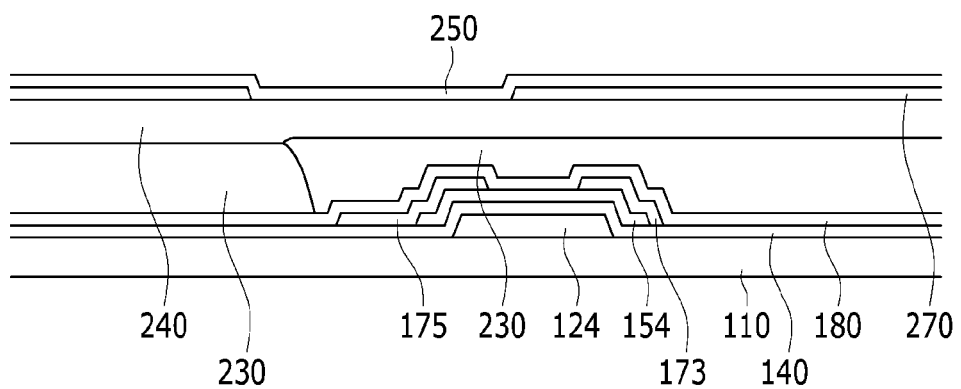
FIGS. 5 to 12 are cross-sectional views sequentially showing a manufacturing method of a display device according to an exemplary embodiment of the present invention.
Figure 6:
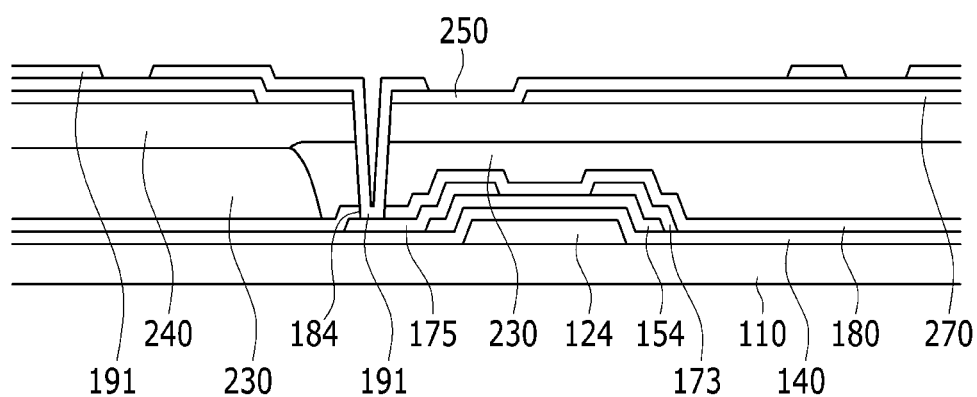

Referring first to FIGS. 5 and 6, a gate line 121 including a gate electrode 124 is formed on an insulation substrate 110, and a gate insulating layer 140 is formed on gate line 121.

A semiconductor 154, a data line 171 including a source electrode 173, and a drain electrode 175 are formed on the gate insulating layer 140.

A passivation layer 180 is formed on the data line 171 and the drain electrode 175.

Next, a color filter 230 is formed in each pixel area PX on the passivation layer 180.

Each color filter 230 may be formed in each pixel area PX and may not be formed in a region where later the first valley V1 forms.

Further, color filters 230 of the same color may be formed along a column direction of the plurality of pixel areas PX.

When forming the color filters 230 of three colors, the color filter 230 of a first color is formed first and then a mask is shifted to form the color filter 230 of a second color.

Next, after forming the color filter 230 of the second color, the mask is shifted to form the color filter of a third color.

Next, an organic layer 240 and a common electrode 270 are formed on the color filter 230, and an insulating layer 250 is formed on the common electrode 270 using an inorganic insulating material such as a silicon nitride (SiNx), and a silicon oxide (SiOx).

Next, the passivation layer 180, the color filter 230, and the insulating layer 250 are etched to form a contact hole 184 such that the drain electrode 175 is partially exposed.

Next, a transparent metallic material such as indium tin oxide (ITO) and indium zinc oxide (IZO) is deposited and then patterned to form a pixel electrode 191 in the pixel area PX.

The pixel electrode 191 is formed to be coupled to the drain electrode 175 through the contact hole 184.

Figure 7:
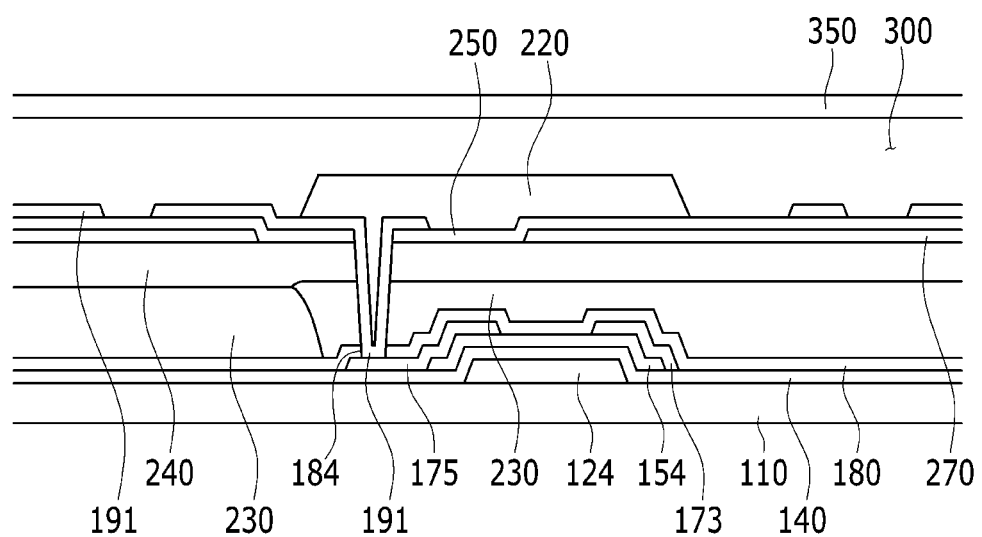

Next, as shown in FIG. 7, a light blocking member 220 is formed to be positioned on a portion of the pixel electrode 191, the insulating layer 250, a boundary of each pixel area PX, and a thin film transistor. That is, the light blocking member 220 covers the thin film transistor and an edge portion of the pixel electrode 191 where the contact hole 184 is formed.

In other words, the light blocking member 220 may be formed in the region where later the first valley V1 forms.

Further, the light blocking member 220 may be formed at one edge of each pixel area PX.

For convenience, it has been described that the color filter 230 is formed first and then the light blocking member 220 is formed, but the present invention is not limited thereto, and the color filter 230 may be formed first after which the light blocking member 220 is formed.

Next, a photosensitive organic material is coated on the pixel electrode 191, and the coated photosensitive organic material is patterned to a sacrificial layer 300 by a photo process.

The sacrificial layer 300 is formed to be connected along a plurality of columns.

That is, the sacrificial layer 300 is formed to cover each pixel area PX. Since the photosensitive organic material at the second valleys V2 is removed in the photo process, the sacrificial layer 300 is not formed at the second valleys V2.

Next, a lower insulating layer 350 may be formed on the sacrificial layer 300 using an inorganic insulating material such as a silicon oxide and a silicon nitride.

Figure 8:
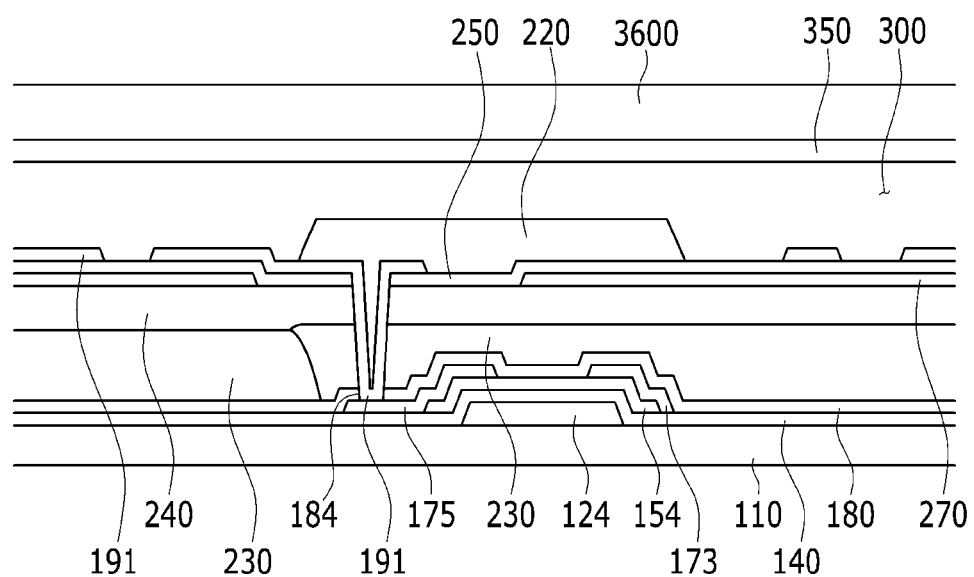

Next, as shown in FIG. 8, an organic layer 3600 is formed on the lower insulating layer 350 using an organic material.

Figure 9:
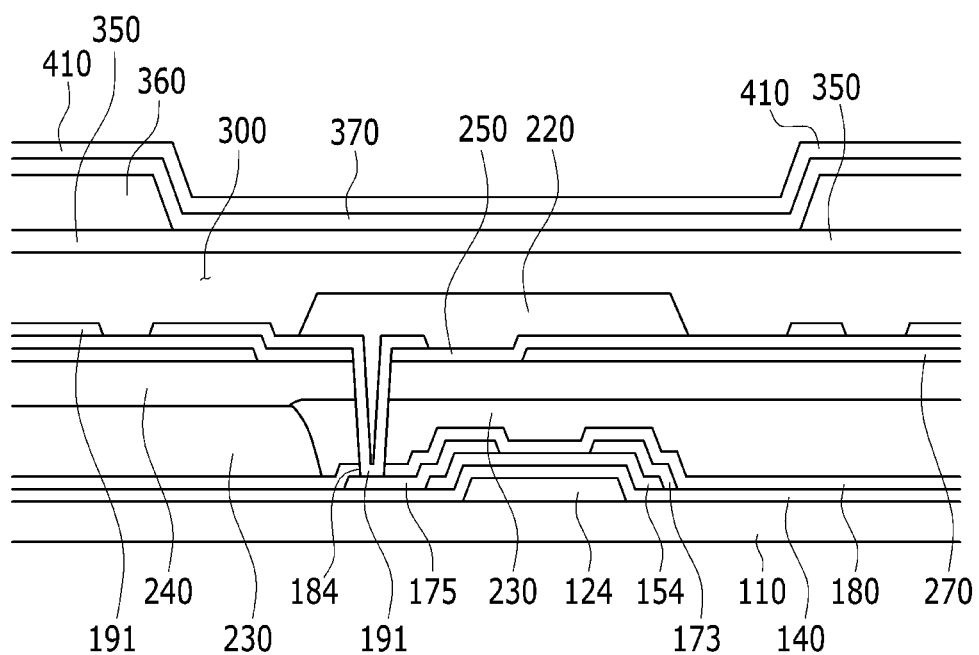

Referring to FIG. 9, the organic layer 3600 formed on the lower insulating layer 350 may be patterned to remove the portions positioned at the first valley V1. The roof layer 360 is formed to be connected along a plurality of pixel rows.

An intermediate insulating layer 370 may be formed on the roof layer 360 using an inorganic insulating material such as a silicon nitride (SiNx) and a silicon oxide (SiOx).

The intermediate insulating layer 370 can cover and protect a lateral side of the roof layer 360 because it is formed on the patterned roof layer 360.

Next, a first touch sensing electrode 410 may be formed on the intermediate insulating layer 370 using a silver nanowire (AgNW), ITO, IZO, CNT, graphene, a metal mesh, or a conductive polymer.

Figure 10:
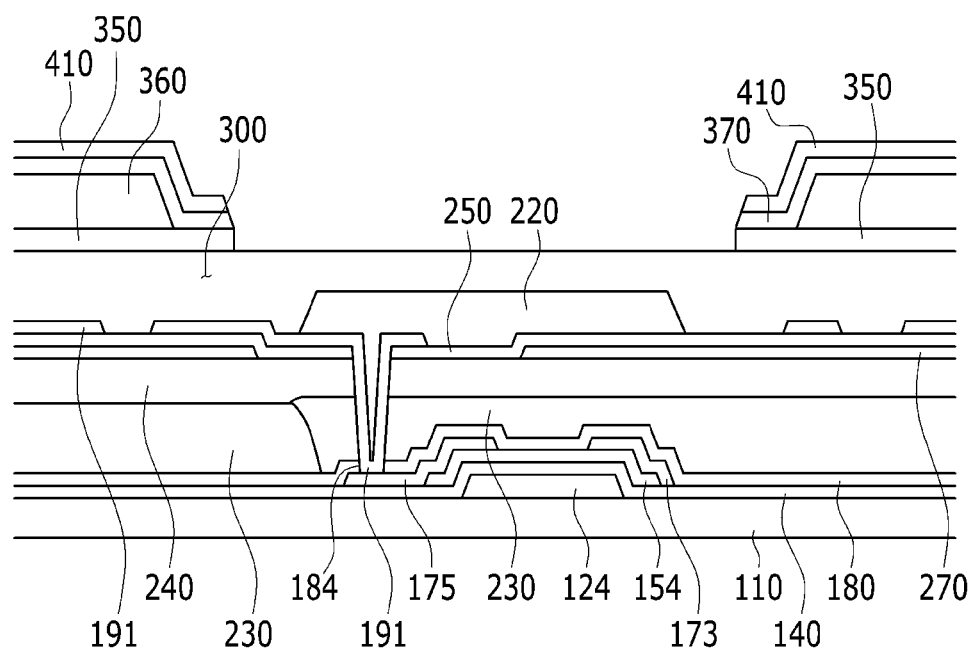

Next, as shown in FIG. 10, the first touch sensing electrode 410, the intermediate insulating layer 370, and the lower insulating layer 350 are patterned to remove the first touch sensing electrode 410, the intermediate insulating layer 370, and the lower insulating layer 350 that are positioned at the first valley V1.

When patterned as described above, the sacrificial layer 300 positioned at the first valley V1 is exposed outside.

Next, as shown in FIG. 11, the sacrificial layer 300 is fully removed by supplying a developer onto the substrate 110 where the sacrificial layer 300 is exposed or by an ashing process.

After the sacrificial layer 300 is removed, the microcavity 305 is formed at a location where the sacrificial layer 300 is previously positioned.

The pixel electrode 191 and the roof layer 360 are separated from each other while interposing the microcavity 305 therebetween.

The roof layer 360 is formed to cover top and opposite lateral sides of the microcavity 305.

The microcavity 305 is exposed outside through a portion where the roof layer 360 is removed, which is referred to as an injection hole 307.

The injection hole 307 is formed along the first valley V1.

Next, the substrate 110 is heated to harden the roof layer 360. This is for the microcavity 305 to maintain its original shape.

Figure 12:
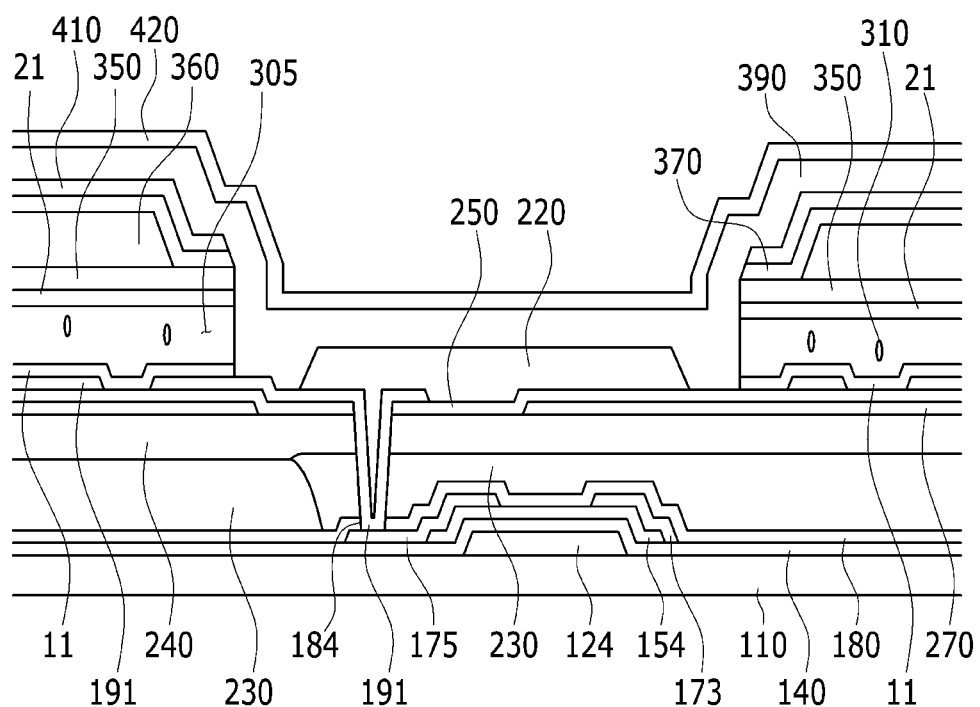

As shown in FIG. 12, when an aligning agent including an aligning material is dripped onto the substrate 110 using a spin coating or Inkjet method, the aligning agent is injected into the microcavity 305 through the injection hole 307.

When a hardening process is performed after injecting the aligning agent into the microcavity 305, a solution component evaporates, and the alignment material remains on a wall surface inside the microcavity 305.

Thus, a first alignment layer 11 may be formed on the pixel electrode 191, and a second alignment layer 21 may be formed under the lower insulating layer 350.

The first alignment layer 11 and the second alignment layer 21 are formed to face each other while interposing the microcavity 305 therebetween and to be coupled to each other at an edge of the pixel area PX.

The first and second alignment layers 11 and 21 may be aligned in a vertical direction with respect to the substrate 110 except for the lateral sides of the microcavity 305.

Additionally, a process of irradiating UV rays to the first and second alignment layers 11 and 21 may be performed to align the first and second alignment layers 11 and 21 in a direction parallel to the substrate 110.

Then, liquid crystal molecules 310 are injected into the microcavity 305.

Next, a material that does not react with the liquid crystal molecules 310 is deposited on the first touch sensing electrode 410 to form an overcoat 390.

The overcoat 390 is formed to cover the injection hole 307 where the microcavity 305 is exposed outside such that it seals the microcavity 305.

A second touch sensing electrode 420 is formed on the overcoat 390 using a silver nanowire (AgNW), ITO, IZO, CNT, graphene, a metal mesh, or a conductive polymer.

In the display device, the second touch sensing electrode 420 may be arranged in each column direction along which the microcavity 305 is formed.

That is, the second touch sensing electrode 420 is formed in each pixel area PX and the first valley V1 along the pixel column, and is not formed in the second valley V2.

An upper insulating layer 380 is formed on the second touch sensing electrode 420 and the overcoat 390 where the second touch sensing electrode 420 is not formed, using an inorganic insulating material such as a silicon nitride (SiNx), a silicon oxide (SiOx), etc.

Next, though not illustrated, polarizers may be attached to top and bottom surfaces of the display device.

The polarizers may consist of a first polarizer and a second polarizer.

The first polarizer may be attached to a bottom surface of the substrate 110, and the second polarizer may be attached on top of the upper insulating layer 380.

Now, a display device according to another exemplary embodiment of the present invention will be described with reference to FIG. 13.

Figure 13:
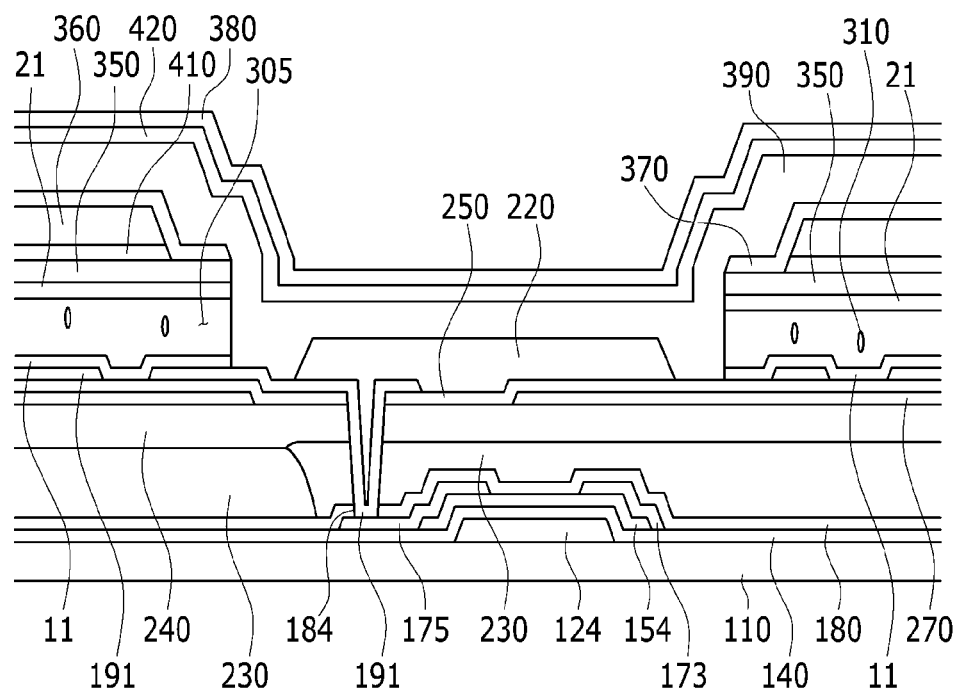
FIG. 13 is a cross-sectional view of a display device according to another exemplary embodiment of the present invention.

FIG. 13 is a cross-sectional view of a display device according to another exemplary embodiment of the present invention.

Since the current exemplary embodiment of the present invention illustrated in FIG. 13 is substantially the same as the exemplary embodiment illustrated in FIGS. 1 to 4 except for a position of the first touch sensing electrode 410, a repeated description will be omitted.

Referring to FIG. 13, a first touch sensing electrode 410 of the display device according to the current exemplary embodiment of the present invention is formed between the lower insulating layer 350 and the roof layer 360, and the second touch sensing electrode 420 may be formed on the overcoat 390.

According to the exemplary embodiments of the present invention, the display device can be manufactured using the single substrate, thereby reducing a thickness, a width, and a cost of the display device as well as simplifying the structure of the display device and the manufacturing process thereof by forming the touch electrode on the top surface of the display device.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a substrate including a plurality of pixel areas;
a thin film transistor formed on the substrate;
a common electrode and a pixel electrode formed on the thin film transistor to overlap each other;
an insulating layer interposed between the common electrode and a pixel electrode;
a liquid crystal layer filling a microcavity formed on the common electrode and the pixel electrode;
a lower insulating layer formed to be spaced apart from the common electrode and the pixel electrode, the microcavity formed between the pixel electrode and the lower insulating layer;
a roof layer formed on the lower insulating layer;
an intermediate insulating layer formed on the roof layer;
a first touch sensing electrode formed on the intermediate insulating layer;
an injection hole partially exposing the microcavity formed on the roof layer, the intermediate insulating layer, and the first touch sensing electrode;
an overcoat formed on the first touch sensing electrode to cover the injection hole and sealing the microcavity; and
a second touch sensing electrode formed on the overcoat.

2. The display device of claim 1, wherein the plurality of pixel areas are differentiated by a first valley that is formed with the injection hole in a row direction and a second valley that is formed between the plurality of pixel areas in a column direction perpendicular to the row direction.

3. The display device of claim 2, wherein
the first touch sensing electrode is formed in each pixel area and the second valley along the plurality of pixel rows, and
the second touch sensing electrode is formed in each pixel area and the first valley along the plurality of pixel columns.

4. The display device of claim 3, wherein
the first touch sensing electrode is not formed in the first valley, and
the second touch sensing electrode is not formed in the second valley.

5. The display device of claim 4, wherein the first and second touch sensing electrodes are formed of one or more selected from a silver nanowire (AgNW), ITO, IZO, carbon nanotubes (CNT), graphene, a metal mesh, and a conductive polymer.

6. The display device of claim 4, further comprising an upper insulating layer formed on the second touch sensing electrode and the overcoat.

7. The display device of claim 6, wherein the lower insulating layer, the intermediate insulating layer, and the upper insulating layer may be formed of one or more selected from a silicon nitride (SiNx), a silicon oxide (SiOx), and a silicon oxynitride (SiOxNy).

8. A display device, comprising:
a substrate including a plurality of pixel area;
a thin film transistor formed on the substrate;
a common electrode and a pixel electrode formed on the thin film transistor to overlap each other;
an insulating layer interposed between the common electrode and the pixel electrode;
a lower insulating layer formed to be spaced apart from the pixel electrode;
a microcavity interposed between the pixel electrode and the lower insulating layer;
a first touch sensing electrode formed on the lower insulating layer;
a roof layer formed on the first touch sensing electrode;
an intermediate insulating layer formed on the roof layer;
an injection hole positioned at one or more edges of the roof layer to partially expose the microcavity;

a liquid crystal layer filling the microcavity;
an overcoat covering the injection hole to seal the microcavity; and
a second touch sensing electrode formed on the overcoat.

9. The display device of claim 8, wherein the plurality of pixel areas are differentiated by a first valley that is formed with the injection hole in a row direction and a second valley that is formed between the plurality of pixel areas in a column direction perpendicular to the row direction.

10. The display device of claim 9, wherein
the first touch sensing electrode is formed in each pixel area and the second valley along the plurality of pixel rows, and
the second touch sensing electrode is formed in each pixel area and the first valley along the plurality of pixel columns.

11. The display device of claim 10, wherein
the first touch sensing electrode is not formed in the first valley, and
the second touch sensing electrode is not formed in the second valley.

12. The display device of claim 11, wherein the first touch sensing electrode and the second touch sensing electrode are formed of one or more selected from a silver nanowire (AgNW), ITO, IZO, carbon nanotubes (CNT), graphene, a metal mesh, and a conductive polymer.

13. A manufacturing method of a display device, the method comprising:
forming a thin film transistor on a substrate;
forming a common electrode on the thin film transistor;
forming a pixel electrode overlapping the common electrode and interposing an insulating layer between the common electrode and the pixel electrode, the pixel electrode coupled to the thin film transistor;
forming a sacrificial layer on the pixel electrode;
forming a lower insulating layer on the sacrificial layer;
forming a roof layer by coating and then patterning an organic material on the lower insulating layer;
forming an intermediate insulating layer on the roof layer and a first touch sensing electrode on the intermediate insulating layer;
exposing the sacrificial layer;
removing the exposed sacrificial layer to form an injection hole and a microcavity between the lower insulating layer and the pixel electrode;
injecting a liquid crystal material into the microcavity through the injection hole;
sealing the microcavity by forming an overcoat on the first touch sensing electrode and the roof layer;
forming a second touch sensing electrode on the overcoat; and
forming an upper insulating layer on the second touch sensing electrode.

14. The manufacturing method of claim 13, wherein
the microcavity into which the liquid crystal material is injected forms a pixel area, and
the pixel area is differentiated by a first valley that is formed with the injection hole in a row direction and a second valley that is formed between the pixel areas in a column direction.

15. The manufacturing method of claim 14, wherein
the first touch sensing electrode is formed in each pixel area and the second valley along the plurality of pixel rows, and
the second touch sensing electrode is formed in each pixel area and the first valley along the plurality of pixel columns.

16. The manufacturing method of claim 15, wherein
the first touch sensing electrode is not formed in the first valley, and
the second touch sensing electrode is not formed in the second valley.

17. The manufacturing method of claim 16, wherein the first touch sensing electrode and the second touch sensing electrode are formed of one or more selected from a silver nanowire (AgNW), ITO, IZO, carbon nanotubes (CNT), graphene, a metal mesh, and a conductive polymer.

18. A manufacturing method of a display device, the method comprising:
forming a thin film transistor on a substrate;
forming a common electrode on the thin film transistor;
forming a pixel electrode overlapping the common electrode and interposing an insulating layer between the pixel electrode and the common electrode, the pixel electrode electrically coupled to the thin film transistor;
forming a sacrificial layer on the pixel electrode;
forming a lower insulating layer on the sacrificial layer;
forming a first touch sensing electrode on the lower insulating layer;
forming a roof layer by coating and then patterning an organic material on the first touch sensing electrode;
forming an intermediate insulating layer on the roof layer;
exposing the sacrificial layer;
removing the exposed sacrificial layer to form an injection hole and a microcavity between the lower insulating layer and the pixel electrode;
injecting a liquid crystal material into the microcavity through the injection hole;
forming an overcoat on the intermediate insulating layer to seal the microcavity; and
forming a second touch sensing electrode on the overcoat.

19. The manufacturing method of claim 18, wherein
the microcavity into which the liquid crystal material is injected forms a pixel area, and
the pixel area is differentiated by a first valley that is formed with the injection hole in a row direction and a second valley that is formed between the pixel areas in a column direction.

20. The manufacturing method of claim 19, wherein
the first touch sensing electrode is formed in each pixel area and the second valley along a row of the pixel area and is not formed in the first valley, and
the second touch sensing electrode is formed in each pixel area and the first valley along a column of the pixel area and is not formed in the second valley.

21. A display device, comprising:
a thin film transistor formed on a substrate;
a common electrode and a pixel electrode formed on a pixel area adjacent to the thin film transistor, the pixel electrode electrically connected to the thin film transistor;
an insulating layer disposed between the common electrode and the pixel electrode;
a roof layer disposed on the substrate;
a liquid crystal layer filling a microcavity formed between the pixel electrode and the roof layer;
a first touch sensing layer and a second touch sensing layer formed on the substrate; and
an overcoat layer interposed between the first touch sensing layer and the second touch sensing layer, covering the pixel area and the thin film transistor, and directly contacting the liquid crystal layer.

* * * * *